(12) United States Patent
Lin et al.

(10) Patent No.: US 7,371,099 B2
(45) Date of Patent: May 13, 2008

(54) SOCKET CONNECTOR

(75) Inventors: Nick Lin, Tu-cheng (TW); Hao-Yun Ma, Tu-Cheng (TW); Chia-Wei Fan, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/501,419

(22) Filed: Aug. 8, 2006

(65) Prior Publication Data

US 2007/0032118 A1 Feb. 8, 2007

(30) Foreign Application Priority Data

Aug. 8, 2005 (TW) .............................. 94213420 U

(51) Int. Cl.
*H01R 13/62* (2006.01)

(52) U.S. Cl. ..................................................... 439/331

(58) Field of Classification Search ................ 439/331, 439/330, 135, 940, 71–73
See application file for complete search history.

(56) References Cited

U.S. PATENT DOCUMENTS

| | | | | |
|---|---|---|---|---|
| 5,348,360 A | * | 9/1994 | Mencarelli et al. | 294/57 |
| 5,511,445 A | * | 4/1996 | Hildebrandt | 74/558.5 |
| 5,867,868 A | * | 2/1999 | Ward | 16/422 |
| 6,006,403 A | * | 12/1999 | Battiato | 16/421 |
| D429,454 S | * | 8/2000 | Lademann, III | D8/303 |
| 6,796,002 B2 | * | 9/2004 | Beckwith | 16/422 |

* cited by examiner

*Primary Examiner*—Alexander Gilman
(74) *Attorney, Agent, or Firm*—Wei Te Chung

(57) ABSTRACT

A socket connector (10) using for electrically connecting a chip module (5) to a printed circuit board includes a housing (11), a number of terminals (12) received in corresponding passageways of the housing (11), a frame (13) mounted around the housing (11), a clip (14) received pivotably in an end of the frame (13) and a lever (15) connecting to an opposite end of the frame (13). The lever (15) being configured as pole-shaped form comprising a base portion (152) and a sleeve for wrapping the base portion (153). The sleeve (153) reduces friction produced between the lever (15) and the clip (14).

10 Claims, 5 Drawing Sheets

SOCKET CONNECTOR

BACKGROUND OF THE INVENTION

1. Field of the Invention

The present invention relates to a socket connector for connecting a chip module and a printed circuit board.

2. Description of the Prior Art

In a conventional socket connector, in particularly, a pin array socket connector generally comprises a metal clip for pressing the chip module into a housing securely, which can maintain a steady and reliable electrical connection between terminals received the housing and the chip module.

A conventional socket connector 8 illustrated in FIG. 7 for connecting a chip module 9 to a printed circuit board (not show) comprises a insulative housing 80, a plurality of terminals (not show) received in corresponding passageways (not show) of the housing 80, a frame 81 disposed around the insulative housing 80, a clip 82 received pivotally in an end of the frame 81 and a lever 83 mounted on an opposed end of the frame 81.

The clip 82 defines a tail 821 and the lever 83 disposes an actuator portion 831 corresponding to the tail 821. When the chip module 9 is mounted on the insulative housing 80, the clip 82 abuts against a top surface of the chip module 9 and the actuator 831 of the lever 83 abuts against the tail 821 of the clip 82, which can position the chip module 9 steadily on the housing, so that the stable location of the chip module 9 can be assured.

In generally, the clip 82 and the lever 83 are made of metal material, so there is always friction between the clip 82 and the lever 83. In addition a coordination relation between the clip 82 and the lever 83 can not be maintained after being used a period of time, which can further influence the stability of the position of the chip module 9.

Thus, there is a need to provide a new electrical connector that overcomes the above-mentioned problem.

SUMMARY OF THE INVENTION

Accordingly, an object of the present invention is to provide a land grid socket connector can prevent the friction between a clip and a lever, which can assure the stability of the location of the chip module.

To fulfill the above-mentioned object, a socket connector in accordance with a preferred embodiment of the present invention comprises a housing, a plurality of terminals received in corresponding passageways of the housing, a frame mounted around the housing, a clip received pivotably in an end of the frame and a lever connecting an opposite end of the frame, wherein the lever being configured as pole-shaped form comprises a base portion, a sleeve for wrapping the base portion.

To compare with the conventional technology, the socket connector in accordance with the invention at least comprise merits as following: the sleeve wrapping the base portion of the lever being made of a plastic or metal material can prevent the friction between the slip and the lever and prolong the life-span thereof, which can further ensure the stability of the location of the chip nodule relative the socket connector.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
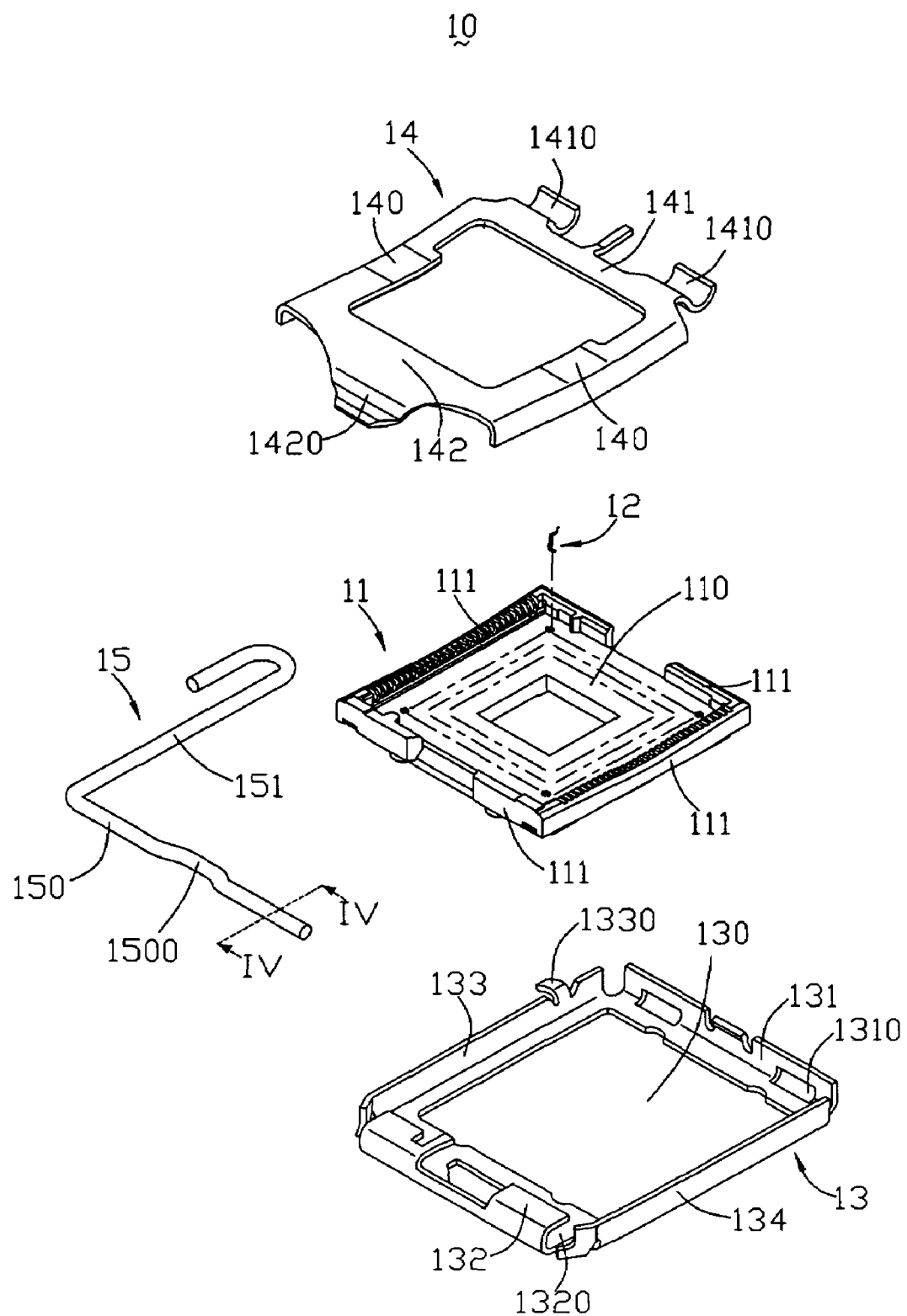
FIG. 1 is an exploded, isometric view of a socket connector of the present invention, wherein terminals not received in a housing.

FIG. 1 is an exploded, isometric view of a socket connector 10 in accordance with a first preferred embodiment of the present invention for carrying and positioning a chip module 5 thereon. The socket connector 10 comprises a housing 11, a plurality of terminals 12 received in corresponding passageways of the housing 11, a frame 13 mounted around the housing 11, a clip 14 received pivotably in an end of the frame 13 and a lever 15 mounted on opposite end of the frame 13.

The generally rectangular housing 11 defines an electrical sector 110 indenting a distance downwardly for receiving the terminals 12, a pair of sidewalls 111 extending upwardly from lateral sides of the electrical sector 110.

The fundamentally rectangular frame 13 made of metal material defines a center cavity 130 for receiving the housing 11, a first engaging section 131 and a second engaging section 132 defined on two opposite ends of the frame 13, and a first sidewall 133 and a second sidewall 134 opposite to the first sidewall 133 for connecting the first engaging section 131 and the second engaging section 312. Besides, the first engaging section 131 of the frame 13 defines a plurality of spaced holes 1310 and the second engaging section 132 form bended a cross passageway 1320. In addition, the frame 13 defines a gear 1330 on a preferred position of the first sidewall 131 adjacent to the first engaging section 133.

The clip 14 defines two pairs of locating portions 140 opposite and parallel to each other, a first connection portion 141 and an opposite second connection portion 142 for connecting the two locating portions 140. The first connection portion 141 extends arcuately a pair of engaging portions 1410, and the second connection 142 portion defines a tail 1420 far away from the first connection portion 141.

The lever 15 defines an operating portion 150, a connection portion 151 extending perpendicularly from an end of the operating portion 150 and a actuating portion 1500 disposed in a middle of the operating portion 150.

Figure 2:
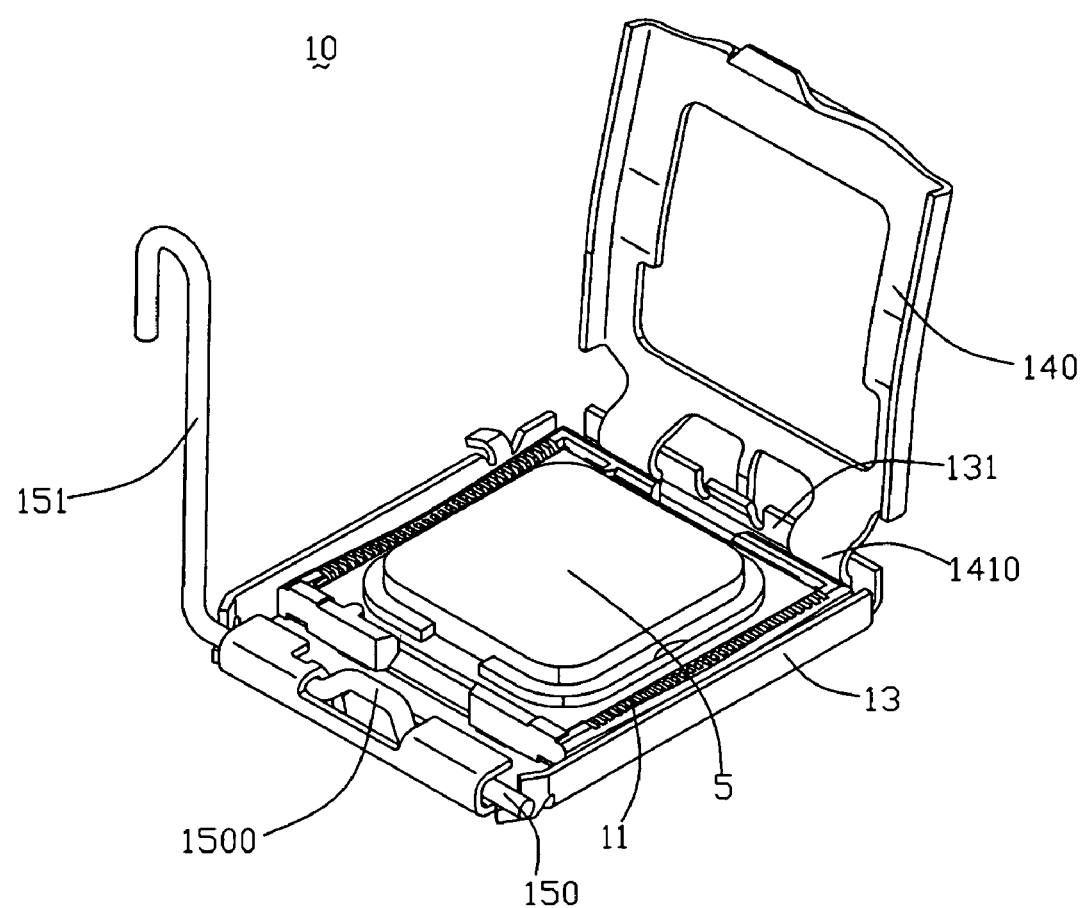
FIG. 2 is an assembled view of the socket connector of FIG. 1, wherein the socket connector is at a open status.

Turning to FIG. 2, a process of assembling the socket connector 10 is described as following steps: firstly inserting the housing 11 in to the cavity 130 of the frame 13 and having them positioned stably with each other, Secondly making the two engaging portions 1410 engage with the holes 1310 of the first engaging section 131 of the frame 13, thereby the clip 14 disposed pivotally on the first engaging section 131 of the frame 13, then putting the actuating pore 150 through the cross passageway 1320 of the second engaging section 132, which can make the lever 15 rotating about the second engaging portion 132 of the frame 15 on pushing the connection portion 151.

Figure 3:
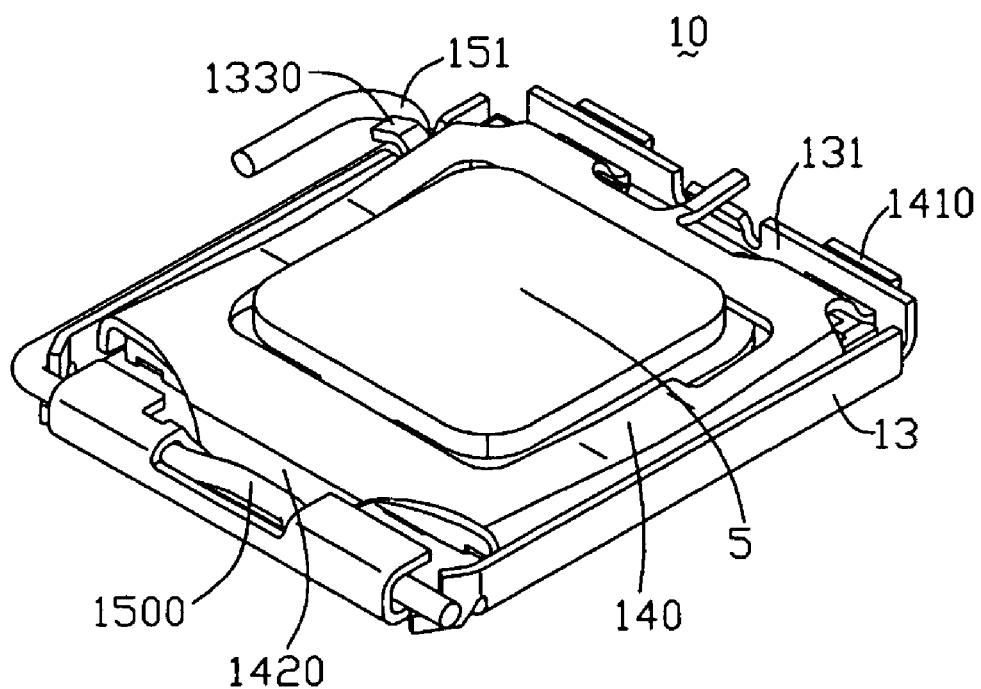
FIG. 3 is assembled view of socket connector of FIG. 1, wherein the socket connector is at a closed status.

Referring to FIG. 3, after the chip module 5 is mounted on the insulative housing 11, rotating the clip 14 to make the locating portion 140 abut against the lateral sides of the chip module 5 and then rotating the lever 15 to make the actuating portion 1500 engage the tail 1420 of the clip 14, finally a distal end of the connection portion 151 of the lever 15 engages with the gear 1330 of the frame 13, so the clip 14 is pressed on the chip module 5 by the lever 15.

Figure 4:
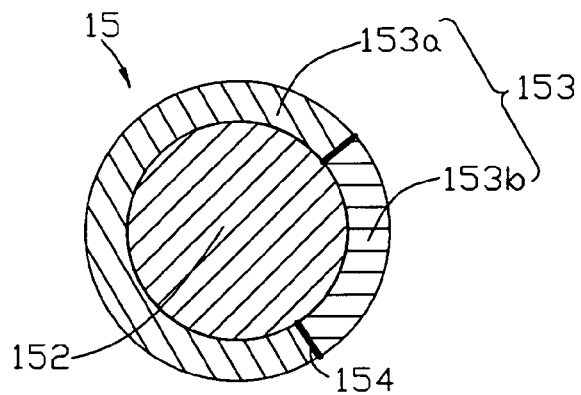
FIG. 4 is an cross-sectional view, taken along line A-A, of a lever of the socket connector of FIG. 1.

Referring to FIG. 4, the lever 15 of the socket connector 10 in accordance with the invention being configured as double-layer means comprise a metal base portion 152, a sleeve 153 wrapping around the peripheral of the base portion 152. The merit of the double-layer level 15 can avoid the direct friction between the clip 14 and the level 15, which can ensure the position of the chip module 5 relative to the housing steadily.

In the above embodiment of the present invention. The sleeve 153 wraps the peripheral surface of the base portion 152 completely. The sleeve 153 disposed as two parts comprises a first section 153a having a bigger wrapping surface and a second section 153b having a smaller wrapping surface secured by an adhesive film 154.

Figure 5:
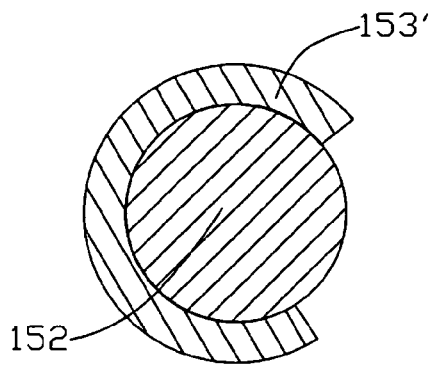
FIG. 5 is an isometric view of a socket connector in accordance with a second preferred embodiment of the present invention.

Referring to FIG. 5, it is a lever 15 of a socket connection 10 in correspondence with a second embodiment of the present invention comprises a sleeve 153' partially wrapping the base portion 152, The sleeve 153' at least wraps half of the peripheral surface of the base portion 152 in order to position the sleeve 153' relative to the base portion 152.

Figure 6:
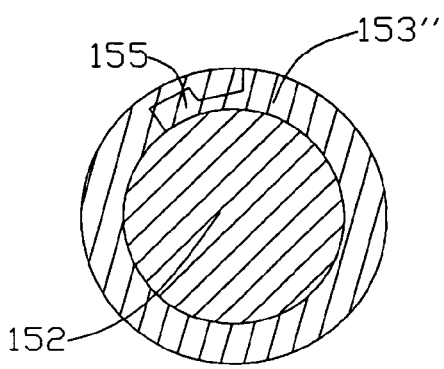
FIG. 6 is an isometric view of a socket connector in accordance with a third preferred embodiment of the present invention.
Figure 7:
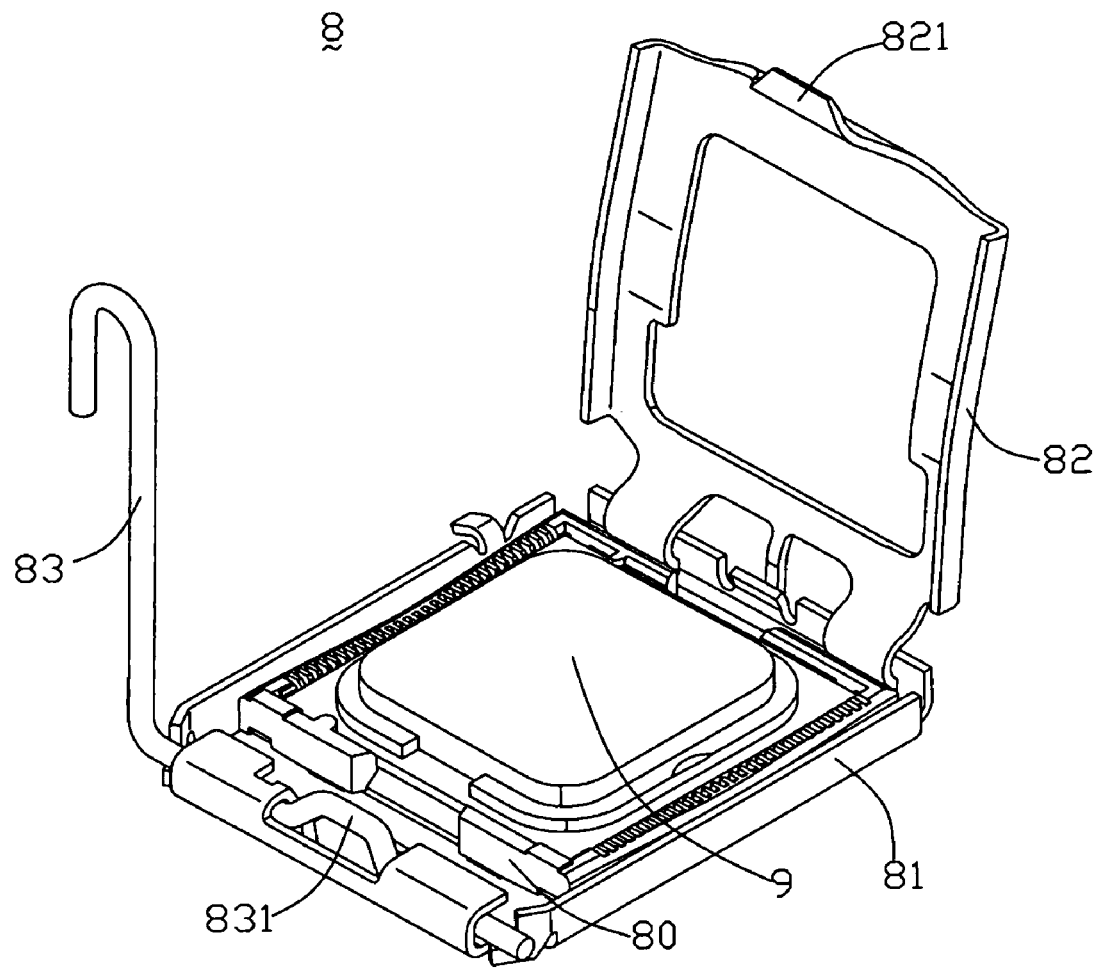
FIG. 7 is an isometric view of a conventional socket connector.

Referring to FIG. 6, it is a lever 15 of a socket connection 10 in correspondence with a third preferred embodiment of the present invention. In this embodiment, a sleeve 153" is disposed wrapping the peripheral surface of the base portion 152 completely and defines a couple of clasping portions 155 at opposite ends thereof for engaging with each other.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector for mounting a chip module to a printed circuit board, comprising:
   a substantially rectangular insulative housing;
   a plurality of electrical terminals received in the housing;
   a frame mounted around the housing;
   a clip assembled pivotably to an end of the frame; and
   a lever mounted to an opposite end of the frame; the lever defines an operating portion, and a connection portion extending perpendicularly from an end of the operating portion, and a base portion disposed concavely in the middle of the operating portion;
   wherein the base portion has a sleeve wrapped in its peripheral surface.

2. The socket connector as claimed in claim 1, wherein the sleeve partially wraps the peripheral surface of the base portion incompletely and a wrapped area of the section is greater than half of the peripheral surface of the base portion.

3. The socket connector as claimed in claim 1, wherein the sleeve wraps the base portion completely and two ends of the sleeve are engaged by two clasping portions thereof.

4. The socket connector as claimed in claim 1, wherein the sleeve comprises a first section having a bigger wrapping surface and a second section having a smaller wrapping surface.

5. The socket connector as claimed in claim 4, wherein the first section and the second section are secured by an adhesive film.

6. A socket connector for mounting a chip module to a printed circuit board, comprising:
   a substantially rectangular insulative housing;
   a plurality of electrical terminals received in the housing;
   a frame mounted around the housing;
   a clip assembled pivotably to an end of the frame; and
   a lever mounted to an opposite end of the frame and cooperating with a distal end of the clip;
   wherein the lever comprises a metallic base defines a section which is fully surrounded by a fully circumferential sleeve which is engageable with the distal end of the clip with less friction therebetween; wherein
   said sleeve experiences forces only at a lower portion thereof, which is located and sandwiched between the distal end of the clip and said section of the metallic base, where other portions of the sleeve experiences no forces.

7. The socket connector as claimed in claim 6, wherein said sleeve is of a non-metal piece.

8. The socket connector as claimed in claim 6, wherein said sleeve includes at least a sealing section so as to result in a sealed manner of said sleeve, under a condition that said seal section is not located in said lover portion and experiences no forces.

9. A socket connector for mounting a chip module to a printed circuit board, comprising:
   a substantially rectangular insulative housing;
   a plurality of electrical terminals received in the housing;
   a frame mounted around the housing;
   a clip assembled pivotably to an end of the frame; and
   a lever mounted to an opposite end of the frame and cooperating with a distal end of the clip;
   wherein the lever comprises a metallic base defines a section which is fully hidden behind a fully circumferentially enclosing material layer which is directly engagable with the distal end of the clip with less friction therebetween; wherein
   said fully circumferentially enclosing material layer experiences forces only at a lower portion thereof, which is located and sandwiched between the distal end of the clip and said section of the metallic base, while other portions of said material layer experiences no forces.

10. The socket connector as claimed in claim 9, wherein said material layer includes at least one a sealing section so as to result in a sealed manner of said material layer, under a condition that said sealing second is not located in said lower portion and experiences no forces.

* * * * *